United States Patent [19]

Fabian et al.

[11] Patent Number: 4,499,656
[45] Date of Patent: Feb. 19, 1985

[54] DEEP MESA PROCESS FOR FABRICATING MONOLITHIC INTEGRATED SCHOTTKY BARRIER DIODE FOR MILLIMETER WAVE MIXERS

[75] Inventors: Walter Fabian, Burlington; Frank H. Spooner, Concord, both of Mass.

[73] Assignee: Sperry Corporation, New York, N.Y.

[21] Appl. No.: 523,232

[22] Filed: Aug. 15, 1983

[51] Int. Cl.³ .................... H01L 21/20; H01L 21/302
[52] U.S. Cl. .................................... 29/576 E; 29/578; 29/580; 29/591; 148/175; 156/647; 156/649; 156/653; 156/659.1
[58] Field of Search .................... 29/576 E, 578, 580, 29/591; 148/175; 156/647, 649, 653, 659.1, 660, 661.1; 427/84

[56] References Cited

U.S. PATENT DOCUMENTS

| | | | |
|---|---|---|---|
| 3,541,403 | 11/1970 | Lepselter et al. | 427/84 X |
| 3,808,470 | 4/1974 | Kniepkamp | 357/15 X |
| 4,196,439 | 4/1980 | Niehaus et al. | 357/15 X |
| 4,218,532 | 8/1980 | Dunkleberger | 156/661.1 X |
| 4,263,340 | 4/1981 | Nuzillat et al. | 427/84 |
| 4,316,201 | 2/1982 | Christou et al. | 357/15 |
| 4,374,012 | 2/1983 | Alderstein | 156/649 |

OTHER PUBLICATIONS

Murphy, R. A. & Clifton, B. J., IEDM 1978, pp. 124–129.
Bates, R. N. et al., MTT 1982, pp. 13–15.
Clifton, B. J. et al., IEEE Trans. Ed-28, No. 2, Feb. 1981, pp. 155–157.
Shaw, D. W., J. Electrochem Soc., SSST, Apr., 1981, pp. 874–879.

Primary Examiner—William G. Saba
Attorney, Agent, or Firm—Howard P. Terry; Arnold L. Albin

[57] ABSTRACT

A method of fabricating gallium arsenide devices in which contact isolation is provided by a deep mesa step structure. Step coverage of deposited conductive films is facilitated by preferential orientation of the non-centrosymmetric crystal substrate and wet anisotropic etching that provides a sloped step. Problems of fine line definition of the Schottky anode contact in the photolithographic process are addressed by a two-step exposure of a single layer of thick photoresist followed by a chlorobenzene soak prior to development that ensures a retrograde resist profile needed for good lift-off of undesired evaporated metal. Mesas as deep as 7 μm have been obtained, which permit the fabrication of monolithic planar mixer millimeter-wave diodes with low series resistance and reduced parasitic capacitance.

37 Claims, 3 Drawing Figures

DEEP MESA PROCESS FOR FABRICATING MONOLITHIC INTEGRATED SCHOTTKY BARRIER DIODE FOR MILLIMETER WAVE MIXERS

BACKGROUND OF THE INVENTION

1. Field of the Invention

The subject invention pertains to the field of monolithic semiconductor circuits and more particularly to a method for fabricating gallium arsenide millimeter-wave surface-oriented Schottky barrier diodes using deep mesa etching.

2. Description of the Prior Art

In the fabrication of monolithic mixers with millimeter-wave surface-oriented Schottky diodes on semi-insulating gallium arsenide substrates, it is necessary to grow or deposit on the substrate a thin lightly doped conductive gallium arsenide layer with a thicker, heavily doped layer of low resistivity underneath. The interface between the two layers must be well defined for maximum performance. This has been achieved in the prior art by incorporating an epitaxially grown or ion implanted n layer 0.1–0.2 $\mu$m thick over an epitaxially grown or ion implanted n+ layer several microns thick. The n+ layer is profiled to provide a small pocket of conducting gallium arsenide in the high resistivity wafer, with the Schottky junction contact on the n layer close to the edge of this region. In order to provide isolation between the Schottky barrier junction and the n+ conductive region, and between adjacent devices on a wafer, either proton bombardment or shallow mesa etching has been used to isolate the conductive areas. In the process of proton bombardment, the diode conducting area is isolated by depositing a layer of silicon dioxide over the device areas to be protected and converting the unprotected epitaxial layers to high resistivity material. It is a significant limitation of proton bombardment that the thickness of the n+ layer must be limited to less than 3.5 $\mu$m, since few implanters have energies above 400 keV, which limits the depth of proton penetration in gallium arsenide accordingly. For optimum performance, thicker n+ layers are needed in order to reduce series resistance and improve the cut-off frequency. (One skin depth at 35 GHz in n+ gallium arsenide is 5.9 $\mu$m.)

Shallow mesa etching (less than 3.5 $\mu$m) has also been used to provide isolation. In the etching process, the highly conducting heavily doped n+ region of gallium arsenide is removed under the Schottky barrier bonding path to provide insulation between the Schottky contact and the ohmic contact. However, only a relatively shallow region has heretofore been etched because of the difficulty in providing electrical contact over the step coverage required by the formation of a deep mesa region for isolating the ohmic contact.

A further problem that occurs with deep mesas is the difficulty of maintaining precise delineation of the fine lines required for millimeter wave devices using conventional photolithographic processes, because of the limited depth of field of the mask projection aligner.

The present invention provides a method for fabricating gallium arsenide millimeter-wave mixer diodes using deep mesa (4–7 $\mu$m) structures. The method provides excellent step coverage of deposited films and accurate photolithographic reproduction of fine lines thus permitting the use of a relatively thick n+ layer with improved low series resistance and reduced parasitic capacitance.

SUMMARY OF THE INVENTION

A method for fabricating semiconductor devices on a non-centrosymmetric semi-insulating substrate comprises a first layer of heavily doped material deposited on the said substrate and a layer of lightly doped material superposed thereon, the substrate being aniostropically etched so as to define a preferred [011] crystallographic direction for formation of a deep mesa with a sloped step. A portion of the superposed layers in the substrate is selectively isotropically etched and metallized to provide an ohmic contact when alloyed with the heavily doped layer. A further region of the substrate and superposed layers is exposed to an anistropic etchant defining in said preferential direction a deep mesa with a sloped wall, followed by depositing an insulating layer overall. Areas of the insulating layer are then selectively removed by etching through a photoresist mask which has been sequentially exposed at differential mask levels to define the Schottky junction and contact areas. The contact areas are then further metallized to provide a second level metal overlay and interconnection to the Schottky junction.

In a preferred embodiment, the photoresist mask is given a chlorobenzene soak after exposure and prior to development to facilitate lift-off of the metal overlays.

DESCRIPTION OF THE PREFERRED EMBODIMENT

Figure 1:
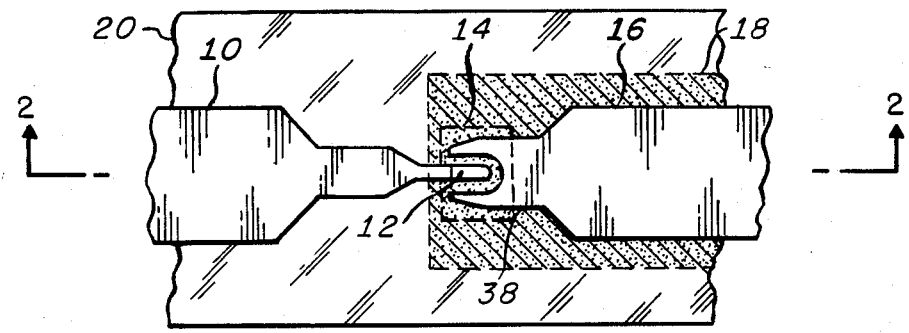
FIG. 1 shows in plan view a Schottky diode semiconductor device.

Referring to FIG. 1, the metallized contact elements of a Schottky diode are shown in plan view. An anode member 10 is electrically connected to an anode contact 12 forming a Schottky junction with an underlying lightly doped layer 14. A cathode member 16 is disposed in proximity to Schottky junction 14 and provides an ohmic contact to a heavily doped contact layer 18 for cathode contact 38. Layers 14 and 18 are formed on a semi-insulating substrate 20. The general structure described is also applicable to other devices of monolithic construction and thus the example illustrated herein is to be construed as exemplary rather than as a limitation.

Figure 2:
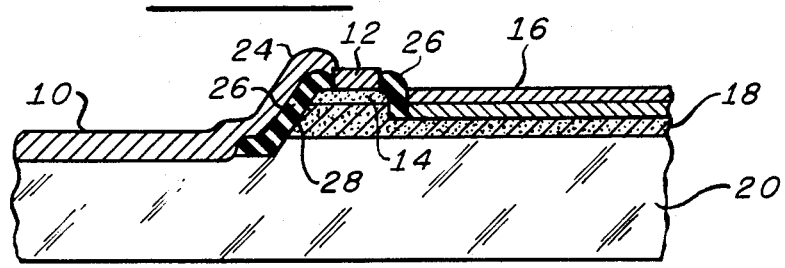
FIG. 2 shows an elevation view through the line 2—2 of the diode of FIG. 1, fabricated by a deep mesa process.

Referring now to FIG. 2, in which the layer thicknesses are exaggerated for clarity, with continued reference to FIG. 1, the semi-insulating substrate 20 typically has a resistivity of the order of $10^7$ ohm-cm and may be comprised of, for example, gallium arsenide. The heavily doped n+ contact layer 18, which may be grown by vapor phase epitaxial deposition, is deposited on the surface of substrate 20. This layer may be of the order of 3.5–5.5 $\mu$m in thickness, and may be doped typically with n-type silicon at $2.5 \times 10^{18}$ cm$^{-3}$ carrier concentration. Superposed on contact layer 18 is lightly doped active layer 22, which is of the order of 0.1–0.2 $\mu$m in thickness and may be doped typically with n-type silicon at a carrier concentration of $1.1 \times 10^{17}$ cm$^{-3}$. Preferably, the n+ contact layer 18 and active n layer 22 may be grown sequentially using an arsenic trichloride vapor phase expitaxial process on undoped two-inch diameter LEC substrates. Also shown is cathode metallization layer 16 of an alloy which may be comprised of sequential layers of nickel, gold, germanium, and gold preferably of thicknesses 50 Å/650 Å/60 Å/200 Å, respectively. Layer 16 may be alloyed to the gallium arsenide substrate by heating to a suitable temperature, whereby the underlying cathode junction layer 18 is converted from a rectifying contact to an ohmic contact, as is known in the art. As shown in FIG. 2, the region of contact layer 18, active layer 22, and substrate 20 underlying anode member 10 has been etched away so that anode member 10 and anode contact 12 are electrically insulated from cathode contact 38. Underlying a layer of interconnect metallization 24 and superposed between cathode 38 and cathode 12 is an insulator 26 which may be formed, for example, from silicon nitride.

Figure 3:
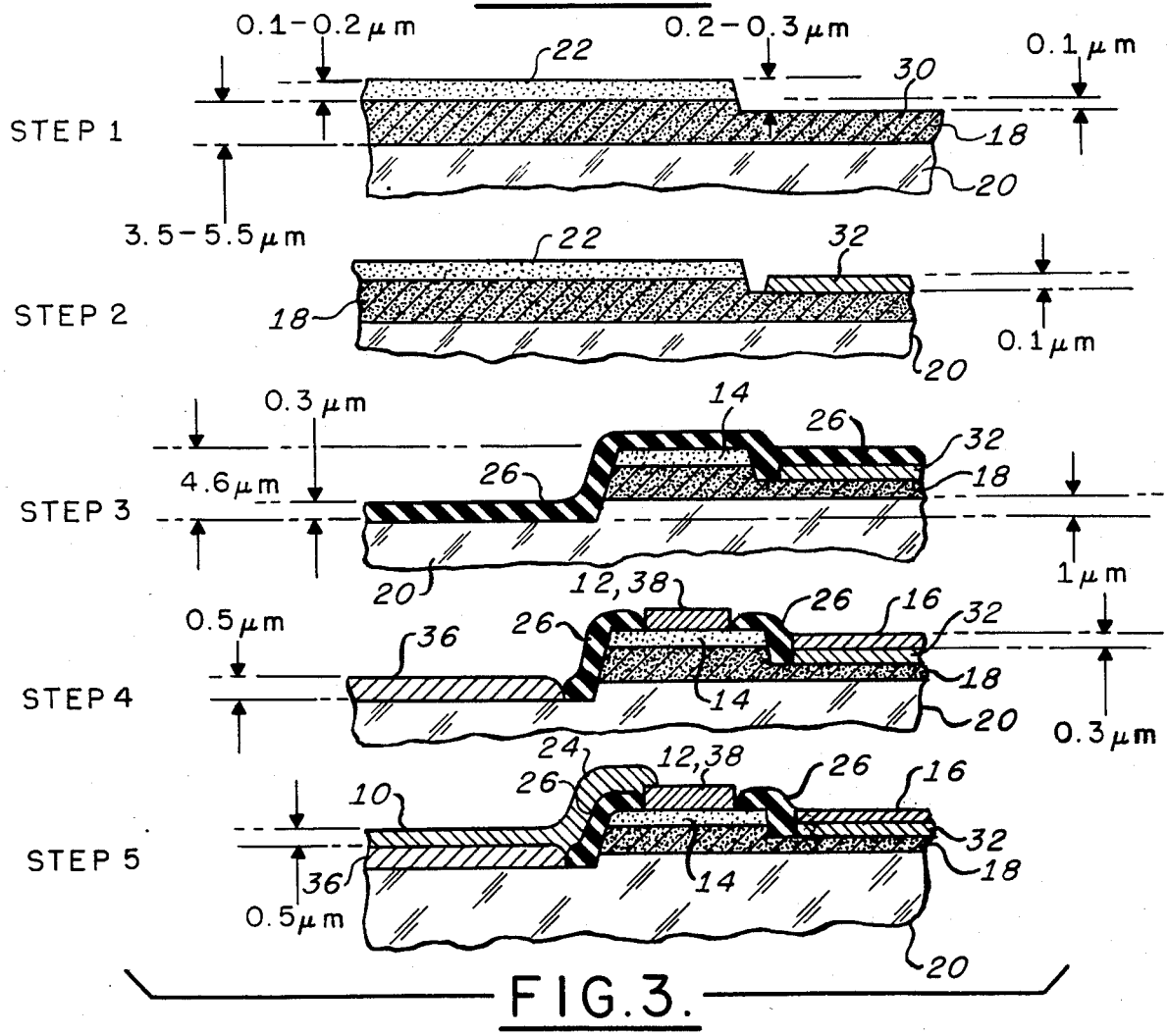
FIG. 3 shows a deep mesa fabrication technique useful in the explanation of the present invention.

The steps in the fabrication of the device of FIG. 2 are shown enlarged in FIG. 3 and will be described below. The examination of FIGS. 1 and 2 shows the critical nature of two features required for successful fabrication of a deep mesa structure. First, the processes for metal deposition as used in the prior art provide coverage essentially only to surfaces orthogonal to the direction of deposition. In consequence, an idealized vertical step has been heretofore been limited to features of the order of 0.75 μm in depth. Further, with the usual isotropic wet etching procedures there may be substantial undercutting of the desired features, further aggravating successful step coverage. It has been observed that if a gallium arsenide substrate, or a substrate of materials with a similar non-centrosymmetric crystal structure such as indium antimonide, indium phosphide, gallium aluminum arsenide, or other compounds formulated from the group III–V elements of the periodic table is exposed to a wet anisotropic etchant reagent with the critical step face of the mesa oriented along the [011] direction, that a suitably tapered step face with gradually sloping walls would be provided which is favorably oriented to accept a deposited metal film. [c.f. D. W. Shaw, Localized GaAs Etching with Acidic Hydrogen Peroxide Solutions, J. Electrochem Soc., SST, 128, 874 (April 1981)] This feature may be noted at step face 28 in FIG. 2.

The second problem is to obtain the fine-line structure of the anode junction 12, the Schottky contact, as shown in FIG. 1. Because of the relatively steep change in depth between the on-mesa and off-mesa regions of the structure, and the limited depth of focus of conventional photolithographic projection devices, it has not heretofore been possible to obtain an adequately defined fine-line structure. Further, the lift-off metallization technique, which utilizes the development of a photoresist stencil pattern on the wafer surface, followed by blanket metallization over the surface, requires extreme control of the photoresist cross-sectional profile. In the novel process to be described herein it will be shown that the pattern exposure problem may be addressed by using a single layer of thick photoresist, selectively and sequentially exposing the on-mesa and off-mesa regions requiring fine line definition, and providing a chlorobenzene photoresist soak prior to metal evaporation and lift off to insure the retrograde resist profile needed for satisfactory lift-off of the overlying undesired metal.

All photolithography may preferably be accomplished by 4:1 projection printing. The thin films of the contact metals permit deposition by evaporation and patterning by lift-off. The metallization and lift-off processes are well known in the art and include the application of a layer of photoresist which is patterned and developed to expose selective regions and provide a stencil-type mask for metallization. Metallization follows techniques known in the art such as, for example, evaporation, which is then followed by the dissolution of the remaining photoresist, which will lift off with it any metallization which has been deposited onto the remaining photoresist. The resulting surface is then ready for additional metallization or further processing.

Device fabrication begins with the printing and wet chemical etching of a master registration level on the substrate, preferably of gallium arsenide. Other compounds selected from the Group III–V elements of the Periodic Table which have a crystallographic structure similar to gallium arsenide may also be used, such as indium antimonide, indium phosphide, gallium aluminum arsenide, gallium indium aluminum arsenide, indium arsenide, gallium phosphide, and gallium aluminum indium phosphide. These registration marks allow the 4:1 projection mask aligner to refocus on the surface prior to each exposure flash and provide an independent means of registration. Essential to the deep mesa process is the proper orientation of the wafer in order to predetermine the [011] direction. A suitable diazo photoresist, such as AZ ®1450 B is deposited on the substrate and spun in a centrifuge at 3,000 rpm, followed by baking at 90° C. for thirty minutes. The photoresist is then exposed through a mask which provides a partial flash near the edge of the wafer. In one example, exposures were "5-3" on a model Cannon FPA 141 projection mask aligner. The exposure setting is a relative calibration of the desired light intensity level in mw/cm$^2$, integrated to provide an exposure of controlled intensity and duration. This exposure will vary with the particular process conditions and mask materials selected. The photoresist is then developed in a 1:1 mixture of MICROPOSIT ® developer and de-ionized water for thirty seconds. A solution of hydrogen peroxide titrated with ammonium hydroxide to a pH of 7 is used for the anisotropic orientation. Etching is allowed to proceed for five minutes. The remaining photoresist is then stripped in an acetone bath. The etched registration pattern is now examined under a high power (1,000×) optical microscope, where edges parallel to the [011] direction will appear narrower than edges parallel to the [01$\bar{1}$] direction. The device mask is then oriented so that the deep mesa step traversed between the on-mesa and off-mesa regions is parallel to the [011] crystallographic direction.

The substrate is again spun with a coating of AZ 1450 B photoresist at 3,000 rpm, and baked at 90° C. for thirty minutes. An exposure of 5-3 is made with nine flashes of the master registration mask level. The photoresist is developed in a 1:1 mixture of developer and deionized water for thirty seconds. This pattern is isotropically etched into the GaAs substrate by using a 3:1:50 mixture of phosphoric acid, hydrogen peroxide and deionized water. The wafer is then stripped in acetone to complete the etching of the master registration level.

The active anode region of the device is then defined by a shallow mesa etch through the n layer followed by a deposition, lift-off and heat treatment of Ni/Au/-Ge/Au for ohmic contact formation. Referring to step 1 of FIG. 3, the substrate 20 has deposited thereon a heavily doped n+-type layer 18 which serves as the contact layer, and superposed thereon a lightly doped n-type active layer 22. The shallow mesa 30 is formed by etching approximately 0.1 μm deep beyond the n/n+ interface. For this step, the wafer is spun with AZ 1450 B photoresist at 3,000 rpm, baked at 90° C. for thirty minutes, and exposed to nine flashes at 5-3 focused on the shallow mesa mask level. The pattern is then developed in a 1:1 mix of developer and deionized water for thirty seconds. A 3:1:50 mixture of phosphoric acid, hydrogen peroxide and de-ionized water is used to isotropically etch into the GaAs substrate. This etchant solution removes GaAs at a rate of about 0.1 μm/min. After etching, the photoresist is stripped in acetone. Since the active n layer is approximately 0.1–0.2 μm in thickness, and the etching proceeds 0.1 μm into the n+ material, the shallow mesa level obtained is of the order of 0.2–0.3 μm.

The formation of the ohmic metal level 32 for the cathode member 16 is shown in step 2. The substrate is spun with AZ 1450 J photoresist at 4,000 rpm, baked at 90° C. for twenty minutes, and the ohmic metal mask level is exposed by nine flashes at an exposure setting of 6-10. A key step to assure the proper resist profile needed for good lift-off of the fine details is provided by soaking the wafer in chlorobenzene for ten minutes. The wafer is air dried for thirteen minutes and the pattern is then developed in a 1:1 mixture of developer and deionized water for three minutes. To ensure that there is no residual photoresist in the exposed "open" regions the substrate is processed in an oxygen plasma etch for one minute at a power level of 300 watts and 300 μm pressure. To remove any native oxide which has formed on the exposed GaAS, the wafer is then dipped into buffered hydrofluoric acid for fifteen seconds just prior to evaporation of the ohmic alloy. Sequential layers of nickel, gold, germanium, and gold in respective thicknesses of 50 Å, 650 Å, 60 Å, and 200 Å are evaporated on the shallow mesa level. The developed pattern is then formed in the evaporated metal. This is obtained by bathing the wafer in acetone which lifts off the remaining photoresist and the metal overlaying it. The ohmic metal is now heated in a furnace at about 470° C. for five minutes to convert the interface to an ohmic contact. After cooling to room temperature, the ohmic contacts are checked electrically to ensure that the contacts are true ohmic contacts, rather than rectifying contacts.

Step 3 illustrates the formation of the deep mesa etch. The wafer is spun with a coating of AZ 1450 J photoresist at 4,000 rpm, baked at 90° C. for twenty minutes, and exposed at 6-10 to nine flashes focused on the deep mesa mask level. The pattern is then developed in a 1:1 mixture of developer and de-ionized water for 40 seconds. The thickness of resist is measured (approximately 1.9 μm) and the pattern anisotropically etched 1 μm deeper than the n+/substrate interface using a 7:3:3 mixture of phosphoric acid:hydrogen peroxide:de-ionized water. The depth is monitored by subtracting the resist height from the measured step height. When the pattern has been etched to a sufficient depth, the photoresist is stripped in acetone. The isolation between devices is then probed electrically to assure that the deep mesa etch has proceeded to a sufficient depth. After the etch step has been completed, a 0.3 μm thick layer of plasma enhanced silicon nitride 26 is deposited by chemical vapor deposition. This layer serves to passivate and insulate exposed areas of the gallium arsenide.

The printing of the Schottky (contact) level involves a double exposure technique with a single developing step to prevent overexposure of the anode junction contact 12. An adhesion promoter such as hexamethyldisilazane (HMDS) is spun on the wafer at 3,000 rpm. A layer of AZ 1375 photoresist is then spun on the wafer at 3,000 rpm and baked at 90° C. for twenty minutes. In defining the Schottky pattern, the first exposure is done with the Schottky metal mask level excluding anode contact 12 and focus is optimized for the "off-mesa" region. Exposure is nine flashes at 7-1 setting. The mask is then replaced by a mask permitting exposure of the anode "on-mesa" region including the anode contact 12 and cathode contact 38. A second exposure of nine flashes is now made, optimized for the on-mesa regions, using 6-10 as the exposure setting. (Note that the interconnect metallization will be subsequently exposed in a separate step). The wafer is then soaked in chlorobenzene for fifteen minutes, again for obtaining a good photoresist lift-off. The wafer is then air dried for thirty minutes and the pattern developed in a 1:1 mixture of developer and de-ionized water for 3 minutes, 50 seconds. After developing the pattern, the wafer is plasma etched in a gaseous mixture of carbon tetrafluoride and oxygen in the ratio 390:10 at a power level of 150 watts for 3.2 min. This etching process exposes windows in the silicon nitride overlay thereby permitting contact to the underlying GaAs wafer. The wafer is then dipped in buffered hydrfluoric acid for fifteen seconds, immediately followed by evaporation of sequential deposits of titanium, palladium, and gold in thicknesses of 200 Å, 200 Å, and 4600 Å, respectively. An acetone wash is used to remove the remaining photoresist and for lift-off of the unwanted metal, thereby leaving the desired metal pattern. Step 4 of FIG. 3 shows the metal layer thereby deposited forming a base layer member 36, Schottky junction elements 12 and 38, and cathode contact 16.

The double exposure technique described above cannot be used for the second level (overlay) metal pattern since it will contain an interconnecting stripe 24 which when patterned in metal will connect both on-mesa and off-mesa areas. However it has been found that it is not necessary for the line width of this stripe to be precisely defined. Hence, a single exposure, optimized for the off-mesa regions is adequate. To prepare for deposition of the second level metal layer, the adhesion promoter HMDS is spun on the wafer at 3,000 rpm, followed by a layer of AZ 1375 photoresist spun on at 3,000 rpm and baked at 90° C. for twenty minutes. The second level metal mask level is exposed for nine flashes at a setting of 7-1. The wafer is then soaked in chlorobenzene for fifteen minutes, followed by a thirty minute air dry. The pattern is developed in a mixture of 1:1 developer and deionized water for four minutes and subjected to an oxygen plasma etch for one minute at a power of 300 W and 300 μm pressure. Next, the wafer is dipped in buffered hydrofluoric acid for fifteen seconds. The second level metal layers of titanium and gold are sequentially deposited to thicknesses of 200 Å and 4800 Å, respectively, over base layer 36 and insulator 26 to form anode member 10 and interconnect stripe 24. The photoresist mask and unwanted metal are then lifted off in acetone. A final electrical test is preferably then made to establish the component D.C. performance and pertinent dynamic parameters, following which the individual devices may be cut from the wafer.

The above procedure in step 3 used an insulating silicon nitride film deposited by a plasma enhanced chemical vapor deposition (CVD). It may be desirable to use pyrolytic CVD deposition which provides a denser, pin hole-free nitride surface. However, the pyrolytic process must be conducted at a high temperature, which can result in reversion of the alloy metal contacts from ohmic to rectifying. Therefore, an alternate method of nitride deposition may be used as shown below; where the basic processing procedures are as outlined above:

Step 1. Orientation of wafer to determine [011] and [01$\bar{1}$] directions by anisotropic etching.

Step 2. Pattern, isotropic etch and strip photoresist to establish master registration level.

Step 3. Pattern, isotropic etch, and strip photoresist to establish shallow mesa level.

Step 4. Pattern, anisotropic etch, and strip photoresist to provide deep mesa level.

Step 5. Deposit 0.1 $\mu$m layer of pyrolytic CVD silicon nitride.

Step 6. Pattern, plasma etch silicon nitride, evaporate Ni/Au/Ge/Au, photoresist lift-off to deposit 0.1 $\mu$m layer of ohmic metal level.

Step 7. Alloy ohmic metal contacts at 470° C.

Step 8. Deposit 0.2 $\mu$m layer of plasma enhanced CVD silicon nitride.

Step 9. Pattern, plasma etch silicon nitride, evaporate Ti/Pd/Au electrodes (0.3 $\mu$m) and lift-off undesired metal to form Schottky anode junction and cathode contact.

Step 10, Pattern, evaporate Ti/Au, and lift-off for second level metal level to form anode contact and interconnect to anode junction.

While the invention has been described in its preferred embodiments, it is to be understood that the words which have been used are words of description rather than of limitations and that changes within the purview of the appended claims may be made without departing from the true scope and spirit of the invention in its broader aspects.

We claim:

1. A method for fabricating semiconductor devices on a non-centrosymmetric semi-insulating substrate, comprising:

disposing a heavily doped contact layer on said substrate, disposing a lightly doped active layer on said contact layer, orienting said substrate in a predetermined crystallographic direction, selectively removing a first region of said active layer and a portion of said contact layer underlying said first region, metallizing said contact layer in said first region to form an ohmic contact, preferentially removing a second region of said active layer, a portion of said contact layer underlying said active layer in said region, and a portion of said substrate underlying said contact layer in said region, said second region longitudinally disposed proximate to and spaced apart from said metallized region, a portion between said first and second regions defining a third intermediate region, the boundary between said second and third regions defining a step region disposed in said predetermined crystallographic direction, depositing an insulating layer over said metallized first region, said second region, said third region, and said step region, depositing a layer of photoresist over said insulating layer, exposing said photoresist through mask means in said second and third regions, said exposure selectively focused to pattern said second and third regions excluding said step region, exposing said photoresist through further mask means focused to pattern said step region, developing said photoresist, selectively removing regions of said insulating layer to expose said second patterned region, said step patterned region, and said third patterned region, metallizing said first, second, and third patterned regions, and further metallizing by means of an overlay disposed thereupon said second patterned region, a portion of said third patterned region, and said step patterned region, whereby said regions are integrally electrically contiguous.

2. The method in accordance with claim 1 in which said semi-insulating substrate comprises a compound selected from the Group III–V elements of the Periodic Table having a crystallographic structure similar to gallium arsenide.

3. The method in accordance with claim 2, in which said compound is selected from the group consisting of gallium arsenide, indium antimonide, indium phosphide, gallium aluminum arsenide, gallium indium aluminum arsenide, indium arsenide, gallium phosphide, and gallium aluminum indium phosphide.

4. The method in accordance with claim 3, in which said compound is comprised of gallium arsenide material.

5. The method in accordance with claim 4, in which the step of disposing a contact layer on said substrate comprises vapor phase deposition of doped gallium arsenide material on said semi-insulating substrate.

6. The method in accordance with claim 5, in which the step of disposing an active layer on said contact layer comprises a further vapor phase deposition of doped gallium arsenide on said contact layer.

7. The method in accordance with claim 1, in which said insulating layer comprises silicon nitride.

8. The method in accordance with claim 7, in which said silicon nitride is deposited by the process of plasma enhanced chemical vapor deposition.

9. The method in accordance with claim 5, in which said contact layer is doped with n type material.

10. The method in accordance with claim 6, in which said active layer is doped with n type material.

11. The method in accordance with claim 1, wherein said first region of said contact layer is metallized with sequential layers of nickel, gold, germanium, and gold.

12. The method in accordance with claim 1, in which said first, second, and third patterned regions and said patterned step are metallized with sequential layers of titanium, palladium, and gold.

13. The method in accordance with claim 12, further comprising a metallizing overlay comprised of sequential layers of titanium and gold.

14. The method of claim 1, wherein said predetermined crystallographic direction comprises the [011] direction and said step is aligned parallel to said direction.

15. The method of claim 14, in which said step forms a sloped wall bounding a deep mesa.

16. The method of claim 15, in which said mesa is at least 4 μm in depth.

17. The method of claim 7, in which said insulating layer is deposited by the process of pyrolytic chemical vapor deposition.

18. The method of claim 1, further comprising soaking said photoresist in a chlorobenzene bath after exposure and prior to development.

19. A method for fabricating semiconductor devices on a non-centrasymmetric semi-insulating substrate, comprising:
 disposing a heavily doped contact layer on said substrate,
 disposing a lightly doped active layer on said contact layer,
 orienting said substrate in a predetermined crystallographic direction,
 selectively removing a first region of said active layer and a portion of said contact layer underlying said first region,
 preferentially removing a second region of said active layer, a portion of said contact layer underlying said active layer in said region, and a portion of said substrate underlying said contact layer in said region, said second region longitudinally disposed proximate to and spaced apart from said metallized region, a portion between said first and second regions defining a third intermediate region, the boundary between said second and third regions defining a step region disposed in said predetermined crystallographic direction,
 depositing a first layer of insulating material over said first region, said second region, said third region and said step region,
 selectively removing a portion of said insulating material over said first region to expose said contact layer,
 metallizing said contact layer in said first region to form an ohmic contact,
 depositing a second layer of insulating material superposed on said first insulating layer and said metallized contact,
 depositing a layer of photoresist over said insulating layer,
 exposing said photoresist through mask means in said second and third regions, said exposure selectively focused to pattern said second and third regions excluding said step region,
 exposing said photoresist through further mask means focused to pattern said step region,
 developing said photoresist,
 selectively removing regions of said insulating layer to expose said second patterned region, said step patterned region, and said third patterned region,
 metallizing said first, second, and third patterned regions, and
 further metallizing by means of an overlay disposed thereupon said second patterned region, a portion of said third patterned region, and said step patterned region, whereby said regions are integrally electrically contiguous.

20. The method in accordance with claim 19, further comprising the step of heating said contact layer after metallizing to 470° for 5 minutes.

21. The method in accordance with claim 19, wherein said first layer of insulating material is deposited by pyrolytic chemical vapor deposition of silicon nitride.

22. The method in accordance with claim 19, wherein said second layer of insulating material is deposited by the process of plasma enhanced chemical vapor deposition of silicon nitride.

23. The method in accordance with claim 19, in which said active layer is doped with n type material.

24. The method in accordance with claim 19, wherein said first region of said contact layer is metallized with sequential layers of nickel, gold germanium, and gold.

25. The method in accordance with claim 24, in which said first, second, and third patterned regions and said patterned step are metallized with sequential layers of titanium, palladium, and gold.

26. The method in accordance with claim 25, further comprising a metallizing overlay comprised of sequential layers of titanium and gold.

27. The method of claim 19, wherein said predetermined crystallographic direction comprises the [011] direction and said step is aligned parallel to said direction.

28. The method of claim 27, in which said step forms a sloped wall bounding a deep mesa.

29. The method of claim 28, in which said mesa is at least 4 μm in depth.

30. The method of claim 19, further comprising soaking said photoresist in a chlorobenzene bath after exposure and prior to development.

31. The method of claim 1, further comprising the step of heating said contact layer after metallizing at 470° for 5 minutes.

32. The method in accordance with claim 19 in which said semi-insulating substrate comprises a compound selected from the Group III-V elements of the Periodic Table having a crystallographic structure similar to gallium arsenide.

33. The method in accordance with claim 32, in which said compound is selected from the group consisting of gallium arsenide, indium antimonide, indium phosphide, gallium aluminum arsenide, gallium aluminum indium arsenide, indium arsenide, gallium phosphide, and gallium aluminum indium phosphide.

34. The method in accordance with claim 33, in which said compound is comprised of gallium arsenide material.

35. The method in accordance with claim 34, in which the step of disposing a contact layer on said substrate comprises vapor phase deposition of doped gallium arsenide material on said semi-insulating substrate.

36. The method in accordance with claim 35, in which the step of disposing an active layer on said contact layer comprises a further vapor phase deposition of doped gallium arsenide on said contact layer.

37. The method in accordance with claim 35, in which said contact layer is doped with n type material.

* * * * *